United States Patent
Yamada

(10) Patent No.: US 7,442,947 B2
(45) Date of Patent: Oct. 28, 2008

(54) ELECTRON-BEAM EXPOSURE SYSTEM AND ELECTRON-BEAM EXPOSURE METHOD

(75) Inventor: Akio Yamada, Tokyo (JP)

(73) Assignee: Advantest Corp., Tokyo (JP)

( * ) Notice: Subject to any disclaimer, the term of this patent is extended or adjusted under 35 U.S.C. 154(b) by 242 days.

(21) Appl. No.: 11/386,636

(22) Filed: Mar. 22, 2006

(65) Prior Publication Data

US 2006/0214117 A1  Sep. 28, 2006

(30) Foreign Application Priority Data

Mar. 28, 2005  (JP) ............................. 2005-092295

(51) Int. Cl.
*H01J 37/304* (2006.01)

(52) U.S. Cl. .............................. 250/492.22; 250/492.23

(58) Field of Classification Search ....................... None
See application file for complete search history.

(56) References Cited

U.S. PATENT DOCUMENTS 6,407,397 B1 *  6/2002  Seto ...................... 250/492.22

\* cited by examiner

*Primary Examiner*—Jack I Berman
(74) *Attorney, Agent, or Firm*—Muramatsu & Associates

(57) ABSTRACT

A multicolumn electron-beam exposure system includes: a plurality of column cells, which are arranged above a wafer, and each of which includes an electron gun and deflection means which deflects an electron beam irradiated from the electron gun; common storage means which stores common exposure data used by the plurality of column cells; and size data correcting means which is provided to each of the column cells, and which receives size data on a variable-shaped beam from the common storage means, thus outputting an amount of correction to the size data. The amount of correction is the size data on the variable-shaped beam, which corresponds to the difference between the size of a resist pattern, which has been formed by specifying an intended pattern size and a reference light exposure, and the intended pattern size.

9 Claims, 8 Drawing Sheets

ELECTRON-BEAM EXPOSURE SYSTEM AND ELECTRON-BEAM EXPOSURE METHOD

CROSS-REFERENCE TO RELATED APPLICATIONS

This application is based on and claims priority of Japanese Patent Application No. 2005-92295 filed on Mar. 28, 2005, the entire contents of which are being incorporated herein by reference.

BACKGROUND OF THE INVENTION

1. Field of the Invention

The present invention relates to an electron-beam exposure system and an electron-beam exposure method. Specifically, the present invention relates to a multicolumn electron-beam exposure system in which a plurality of columns are arranged above a single wafer, and which performs exposure processes in the columns simultaneously, and relates to an electron-beam exposure method using the exposure system.

2. Description of the Prior Art

In a case of conventional electron-beam exposure systems, a variable rectangular opening or a plurality of stencil mask patterns are prepared in a stencil mask. One of the mask patterns is selected by means of beam deflection, and the mask pattern thus selected is transferred onto a wafer by exposure. In the case of these electron-beam exposure systems, a plurality of mask patterns are prepared. However, it is one electron beam that is used for the exposure, and thus, it is only one mask pattern that is transferred thereon at a time. For this reason, in order to make a workpiece full of formed patterns, the patterns are formed in a way that the patterns are arranged next to one another.

As one of such electron-beam exposure systems, an electron-beam exposure system which performs a "partial one-shot exposure" has been disclosed, for example, in Japanese Patent Laid-open Official Gazette No. 2004-88071. What the "partial one-shot exposure" means is as follows. To begin with, by means of beam deflection, one pattern area is selected out of a plurality of stencil patterns, for example, out of one hundred stencil patterns, which are arranged on a mask. Then, a beam is irradiated on the pattern area thus selected, for example, in a 300 μm×300 μm area. Thereby, the cross section of the beam is shaped into a form identical to the selected stencil pattern. Subsequently, the beam, which has passed through the mask, is swung back by a deflector in the subsequent step. Then, the cross section of the beam is reduced with a certain reduction ratio, for example, 1/60, which is determined by the electro-optic system. Thus, the selected stencil pattern is transferred onto the workpiece. An area of the workpiece on which the beam is irradiated at a time is, for example, 5 μm×5 μm in size. If a stencil pattern on the mask is adequately prepared corresponding to a device pattern to be obtained by exposure, this makes it possible to reduce the number of necessary exposure shots to a large extent, and to increase the throughput, in comparison with a case where only a variable rectangular opening is used.

In addition, a multicolumn electron-beam exposure system has been proposed (see Haraguchi, T., et. al., *J. Vac. Sci. Technol*, B22(2004)985). The multicolumn electron-beam has a configuration in which a plurality of such columns in a reduced size (hereinafter referred to as "column cells") are arranged collectively above a wafer, and performs exposure processes in the plurality of column cells simultaneously. Each of the column cells is similar to the column of the single-column electron-beam exposure system. However, the multicolumn electron-beam exposure system performs the processes in parallel. Accordingly, this makes it possible to increase the throughput of exposure by K times (K=the number of columns).

As described above, a multicolumn electron-beam exposure system which performs parallel processes by use of a plurality of column cells for the purpose of increase the throughput of exposure has been proposed. In order to increase the throughput of exposure by use of a multicolumn electron-beam exposure system of this type, the column cells need to be designed to have the same functions to the respective beams passing through the column cells.

Each column cell has an individual mechanical error in association with the manufacture and an individual assembly error. As a result, slight difference in lens intensity and deflection efficiency concerning a beam occurs among the column cells, even though the same lens conditions and deflection data are given to the column cells. For this reason, individual lens power supplies and individual control systems are prepared respectively for the column cells. Thus, outputs from the lens power supplies and control outputs from the control systems are determined in order that beam characteristics respectively of the column cells become the same. The individual lens power supply independently drives the lens in each of the column cell. The control system controls deflection efficiencies of the deflectors and outputs from the compensation coils in each of the column cells.

Specifically, a current value of the workpiece, beam deflection positions, in-shot intensity distributions and the like are measured by use of an ammeter, back-scattered electron detectors and secondary electron detectors. On the basis of the result of the measurement, the outputs from the lens power supplies and the control outputs from the control systems are determined in order that the beam characteristics of all of the column cells become identical to one another.

In some cases, however, it is difficult to measure the beam characteristics by use of the aforementioned method. For example, with regard to a characteristic of a variable-shaped beam whose cross-section has a rectangular shape, the more microscopic the beam is, the smaller the beam current is. Accordingly, it is difficult to precisely measure the current value of the workpiece, the beam deflection positions and the in-shot intensity distributions. For this reason, in a beam adjusting step of determining a value of the output from the lens power supply and a value of the control output in each of the column cells, the value of the output from the lens power supply and the value of the control output are determined on the basis of a beam whose cross section is a variable rectangle, but which is not reduced to be microscopic. This case causes a phenomenon where a pattern obtained by exposure using a variable-shaped beam whose cross section has been shaped into a microscopic variable rectangle is different from a desired pattern.

As a countermeasure against this, it is conceivable that the exposure data themselves are corrected in order that the size of a pattern to be actually obtained by exposure can correspond to an intended size. However, this is not an effective method for the multicolumn electron-beam exposure system. Specifically, if exposure data themselves are intended to be changed with regard to patterns to be exposed respectively in the column cells in order that the sizes as the result of the exposure become the intended sizes, this change requires the exposure data to be prepared for every column. Accordingly, this is unrealistic in view of data capacity and time that are required to establish the corrected data.

SUMMARY OF THE INVENTION

The present invention has been made in view of the problems with the conventional techniques. An object of the present invention is to provide a multicolumn electron-beam exposure system and a multicolumn electron-beam exposure method, which enables the same patterns to be exposed through a plurality of column cells even though variable-shaped beams whose cross sections have a rectangular shape are used respectively.

The aforementioned problems are solved by a multicolumn electron-beam exposure system characterized by including a plurality of column cells, common storage means and size data correcting means. The plurality of column cells are arranged above a single wafer, and each of the column cells includes an electron gun and deflection means which deflects an electron beam irradiated from the electron gun. The common storage means stores common exposure data which are used by the plurality of column cells. The size data correcting means is provided to each of the column cells. The size data correcting means receives size data on a variable-shaped beam from the common storage means, and thus outputs an amount of correction to the size data.

In the multicolumn electron-beam exposure system according to this mode, each of the column cells may further include exposure data converting means. The exposure data converting means converts the size data to corrected size data on the basis of the amount of correction obtained by the size data correcting means, and thereby calculates an amount of control for operating each of the column cells, thereafter outputting the amount of control to each of the column cells.

In addition, the amount of correction may be size data on a variable-shaped beam, which correspond to the difference between the size of a resist pattern, which has been formed by means of specifying an intended pattern size, and the intended pattern size.

In the case of the present invention, a resist intended to be exposed is beforehand exposed with a reference light exposure in each of the column cells. Thus, an amount of correction to the beam size is determined in order that the size of the pattern formed on the resist becomes equal to the intended pattern size. On the basis of this amount of correction, the exposure data of each of the column cells are corrected. Accordingly, it becomes possible to expose the same patterns in the multicolumn electron-beam exposure system in a case where a microscopic beam whose cross section has a rectangular shape is used. Thus, it is possible to increase the throughput of the exposure.

Furthermore, the aforementioned problems are solved by a multicolumn electron-beam exposure system characterized by including a plurality of column cells, common storage means and flash time length correcting means. The plurality of column cells are arranged above a single wafer. Each of the plurality of column cells includes an electron gun and deflection means which deflects an electron beam irradiated from the electron gun. The common storage means stores common exposure data which are used by the plurality of column cells. The flash time length correcting means is provided to each of the column cells. The flash time length correcting means receives size data on a variable-shaped beam from the common storage means, and thus outputs an amount of, or a coefficient on, correction to a flash time length for which the beam is being irradiated, the flash time length corresponding to the size data.

In the case of the multicolumn electron-beam exposure system according to this mode, each of the column cells may further include exposure data converting means which converts the aforementioned flash time length to corrected flash time length obtained by the correction, and which thus outputs the corrected flash time length to the column cell.

Moreover, the aforementioned amount of correction and the aforementioned coefficient on correction may be respectively an amount of, and a value on, correction to the exposure flash time length, the correction corresponding to the difference between the size of a resist pattern, which has been formed by means of specifying an intended pattern size and a reference light exposure, and the intended pattern size.

In the case of the present invention, the intended resist is beforehand exposed with the reference light exposure through each of the column cells. Thus, the amount of correction to the flash time length is determined in order that the size of the pattern to be formed on the resist becomes equal to the intended pattern size. On the basis of this amount of correction, the exposure data in each of the column cells are corrected. Accordingly, it becomes possible to expose the same patterns by use of the multicolumn electron-beam exposure system even in the case where the beams of microscopic variable rectangles in cross section are used. As a result, it is possible to increase the throughput of the exposure.

Further, the aforementioned problems are solved by a multicolumn electron-beam exposure method of the present invention for exposing patterns on a single wafer in parallel by use of a plurality of column cells each for irradiating an electron beam on a single workpiece while deflecting the electron beam. The multicolumn electron-beam exposure method is characterized by including the steps of: transferring a pattern onto a predetermined resist by exposure for a reference flash length time by use of each of the plurality of column cells on the basis of variable-shaped size data thereof; measuring the difference between the size of the pattern obtained in each of the column cells and an intended pattern size; determining an amount of correction to the variable-shaped size data in order that the size of the pattern becomes equal to the intended pattern size; storing a relationship between the intended pattern size and the amount of correction in correction value storing means; and individually correcting the variable-shaped size data in each of the column cells in response to the intended pattern size of the column cell, and thus exposing the same pattern.

In the case of the present invention, a resist to be exposed is beforehand exposed with the reference light exposure, and thus the amount of correction is determined in order that the size of pattern formed on the resist becomes equal to the intended pattern size. Subsequently, the relationship between the intended pattern size and this amount of correction is stored in the correction value storing means in each of the column cells. Thereby, in a case where a pattern is formed on a resist for which the amount of correction has been determined, the exposure data can be corrected by the amount of correction on the basis of the intended pattern size. Accordingly, it becomes possible to expose the same patterns by use of the multicolumn electron-beam exposure system even in the case where microscopic beams whose cross sections have a rectangular shape are used. As a result, it is possible to increase the throughput of the exposure.

DESCRIPTION OF THE PREFERRED EMBODIMENTS

Hereinafter, descriptions will be provided for embodiments of the present invention with reference to the drawings.

To begin with, descriptions will be provided for a configuration of a multicolumn electron-beam exposure system which is common among the embodiments. In each of the embodiments, descriptions will be provided for a process of, and a multicolumn electron-beam exposure method of, enabling column cells to expose the same patterns even for microscopic beams whose cross sections have a rectangular shape.

(Configuration of Multicolumn Electron-Beam Exposure System)

Figure 1:
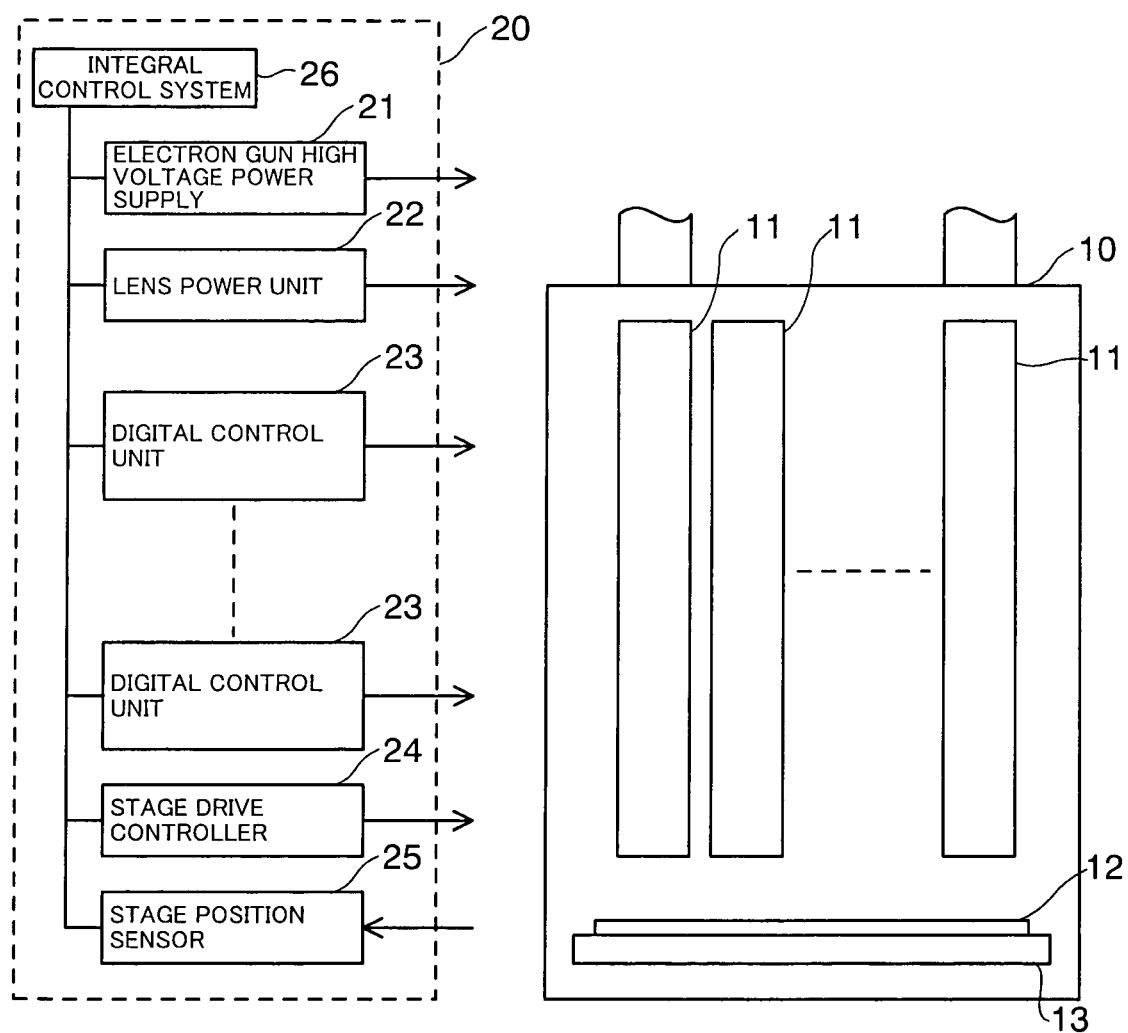
FIG. 1 is a diagram of a configuration of a multicolumn electron-beam exposure system according to the present invention.

FIG. 1 is a schematic diagram of a multicolumn electron-beam exposure system according to this embodiment. The multicolumn electron-beam exposure system is roughly broken down into an electron-beam column 10 and a control module 20 for controlling the electron-beam column 10. The electron-beam column 10 as a whole is configured of a plurality of column cells 11, for example, of 16 column cells 11. Those column cells are similar to one another. Every column cell is configured of the same unit, which is described later. A wafer stage 13 is arranged under the column cells 11. For example, a wafer 12 of 300 mm in diameter is mounted on the wafer stage 13.

The control module 20 includes an electron gun high voltage power supply 21, a lens power supply 22, digital control units 23, a stage drive controller 24 and a stage position sensor 25. The electron gun high voltage power supply 21 supplies power for the purpose of driving an electron gun of each of the column cells 11 in the electron-beam column 10. The lens power supply 22 supplies power for the purpose of driving electromagnetic lenses of each of the column cells 11 in the electron-beam column 10. Each of the digital control units 23 is an electric circuit for controlling each of the column cells 11, and delivers a high-speed deflection output and the like to each of the column cells 11. The digital control units 23, which are as many as the number of the column cells 11, are prepared. The stage drive controller 24 moves the wafer stage 13 on the basis of position information from the stage position sensor 25 in order that an electron beam can be irradiated on a desired position on the wafer 12. The aforementioned units 21 to 25 are integrally controlled by an integral control system 26 such as a workstation.

In the case of the aforementioned multicolumn electron-beam exposure system, every column cell 11 is configured of the same column unit.

Figure 2:
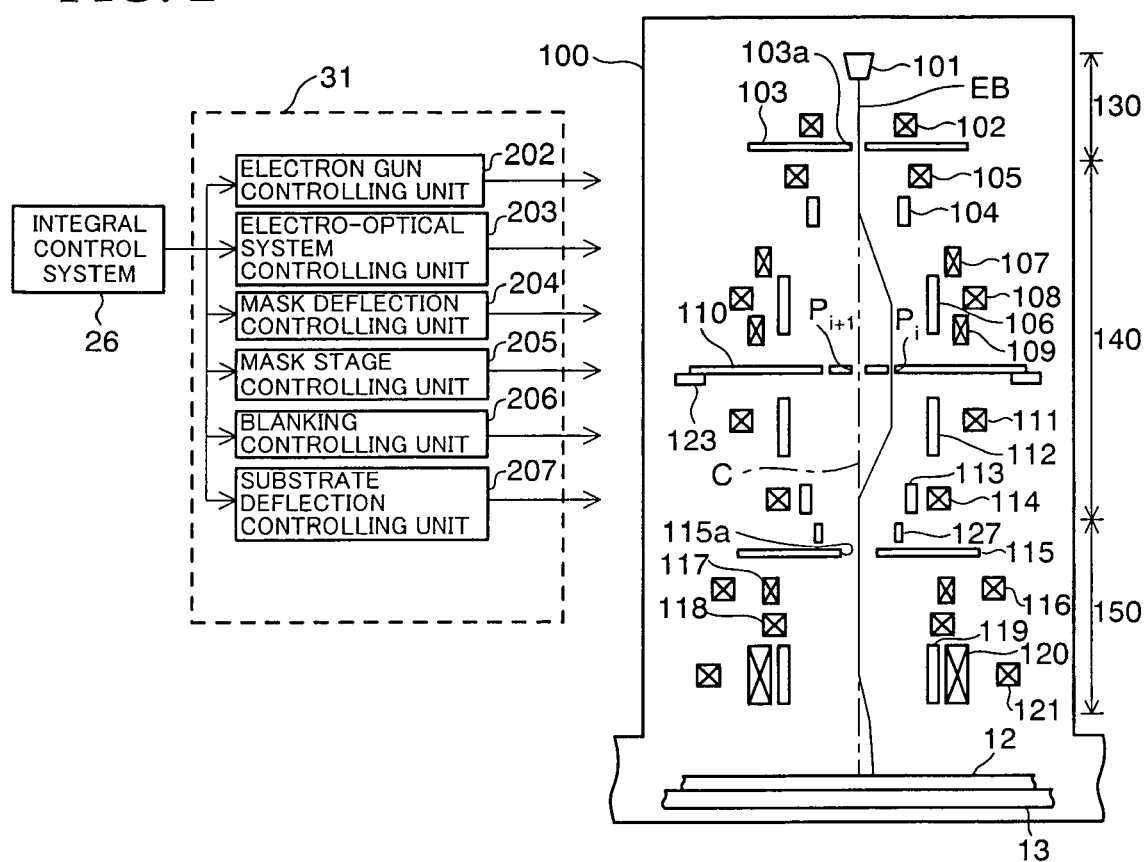
FIG. 2 is a diagram of a configuration of one column cell in the exposure system shown in FIG. 1.

FIG. 2 is a diagram of a configuration of each of the column cells 11 used in the multicolumn electron-beam exposure system.

Each of the column cells 11 is roughly broken down into an exposure module 100 and a column cell controlling module 31 for controlling the exposure module 100. The exposure module 100 is configured of an electron-beam generating unit 130, a mask deflection unit 140 and a substrate deflection unit 150.

In the electron-beam generating unit 130, an electron beam EB generated by an electron gun 101 is caused to undergo convergence effects in a first electromagnetic lens 102. Thereafter, the electron beam EB is transmitted through a rectangular aperture 103a of a beam shaping mask 103, and thereby the cross section of the electron beam is shaped into a rectangle.

Subsequently, the electron beam EB forms an image on an exposure mask 110 by means of a second electromagnetic lens 105 in the mask deflection unit 140. Then, the electron beam EB is deflected onto a specific pattern P formed in the exposure mask 110 by a first and a second electrostatic deflectors 104 and 106, and thus the cross section of the electron beam is shaped into a shape of the pattern P.

It should be noted that, although the exposure mask 110 is fixed to a mask stage 123, the mask stage 123 can be displaced in a horizontal plane. In a case where the pattern P existing in a part beyond a deflection range (a beam deflection area) of the first and the second electrostatic deflectors 104 and 106 is intended to be used, the pattern P is displaced to the beam deflection area by means of displacing the mask stage 123.

A third and a fourth electromagnetic lenses 108 and 111 arranged respectively above and under the exposure mask 110 play roles in causing the electron beam EB to form the image on a substrate by means of adjusting amounts of current in each of the lenses 108 and 111.

The electron beam EB which has passed through the exposure mask 110 is swung back to an optical axis C by means of deflection effects of a third and a fourth deflectors 112 and 113. Thereafter, the electron beam EB is reduced in size by a fifth electromagnetic lens 114.

A mask deflecting unit 140 is provided with a first and a second correction coils 107 and 109. Aberration of the beam deflection produced by the first to the fourth electrostatic deflectors 104, 106, 112 and 113 is corrected by these correction coils.

Thereafter, the electron beam EB passes through an aperture 115a of a shielding plate 115 constituting a substrate deflection unit 150, and is projected onto the substrate by a first and a second projection electromagnetic lenses 116 and 121. Thereby, an image of the pattern of the exposure mask 110 is transferred to the substrate with a predetermined reduction ratio, for example, with a ratio of 1/60.

The substrate deflection unit 150 is provided with a fifth electrostatic deflector 119 and an electromagnetic deflector 120. The electron beam EB is deflected by these deflectors 119 and 120. Thereby, the image of the pattern of the exposure mask is projected onto a predetermined position in the substrate.

The substrate deflection unit 150 is further provided with a third and a fourth correction coils 117 and 118 for correcting deflection aberration of the electron beam EB on the substrate.

The column cell controlling module 31 includes an electron gun controlling unit 202, an electro-optical system controlling unit 203, a mask deflection controlling unit 204, a mask stage controlling unit 205, a blanking controlling unit 206 and a substrate deflection controlling unit 207. The electron gun controlling unit 202 controls the electron gun 101, and thus controls an acceleration voltage, conditions for beam radiation, and the like of the electron beam EB. The electro-optical system controlling unit 203 controls an amount of electric current and the like to each of the electromagnetic lenses 102, 105, 108, 111, 114, 116 and 121, and thus adjusts a magnification, a focal position and the like of the electro-optical systems of these electromagnetic lenses. The blanking controlling unit 206 controls a voltage to be applied to a blanking electrode 127. Thereby, the blanking controlling unit 206 deflects the electron beam EB, generated before exposure, to the shielding plate 115, and thus prevents the electron beam EB from being irradiated on the wafer before the exposure.

The substrate deflection controlling unit 207 controls a voltage applied to the fifth electrostatic deflector 119 and an amount of electric current supplied to the electromagnetic deflector 120. Thereby, the substrate deflection controlling unit 207 deflects the electron beam EB to the predetermined position on the substrate. The aforementioned units 202 to 207 are integrally controlled by the integral control system 26 such as a workstation.

Figure 3:
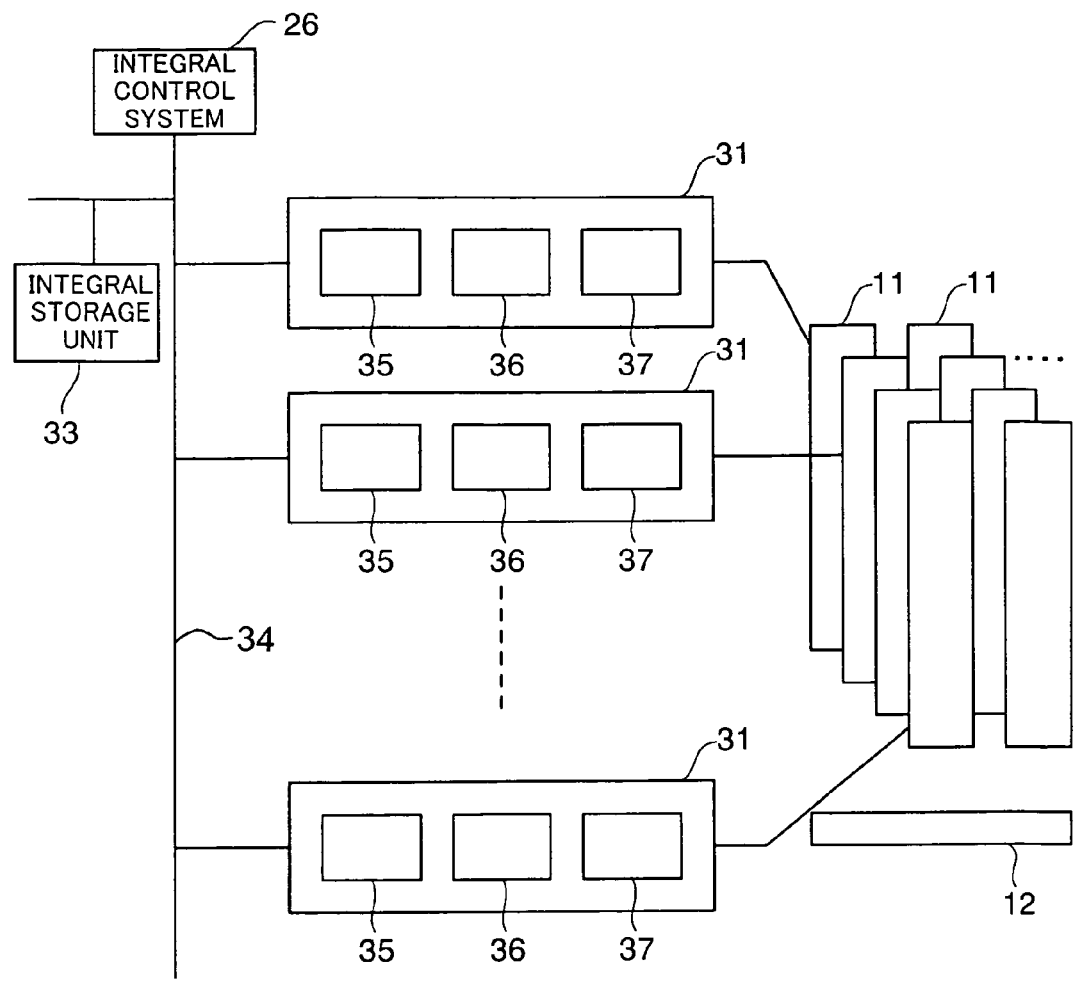
FIG. 3 is a schematic diagram of a column cell controlling module in the exposure system shown in FIG. 1.

FIG. 3 is a schematic diagram of each of the column cell controlling modules 31 in the multicolumn electron-beam exposure system. Each of the column cells 11 has one column cell controlling module 31. Each of the column cell controlling modules 31 is connected to the integral control system 26 through a bus 34. The integral control system 26 controls the entire multicolumn electron-beam exposure system. In addition, data necessary in every column cell are stored in an integral storage unit 33. The data include exposure data and the like. The integral storage unit 33 is also connected to the integral control system 26 through the bus 34.

In the multicolumn electron-beam exposure system configured in this manner, exposure data on a pattern to be transferred onto the wafer 12 placed on the wafer stage 13 by exposure is transferred from the integral storage unit 33 to the column cell storage units 35 respectively of the column cell controlling modules 31. The exposure data thus transferred is corrected by a correction unit 36 in each of the column cell controlling modules 31. Thus, the same patterns are transferred, by exposure, onto exposure areas on the wafer 12, the exposure areas being assigned respectively to the column cells 11.

Descriptions will be provided for correction processes which are carried out in each of the column cell controlling modules 31 with respect to the following embodiments. It should be noted that discussion will be given to the correction processes which are carried out in a case where an exposure is performed using microscopic beams whose cross sections have a rectangular shape, and it is supposed that lens power supplies and control outputs necessary for obtaining desired patterns are beforehand determined as reference exposure data.

FIRST EXAMPLE

Figure 4:
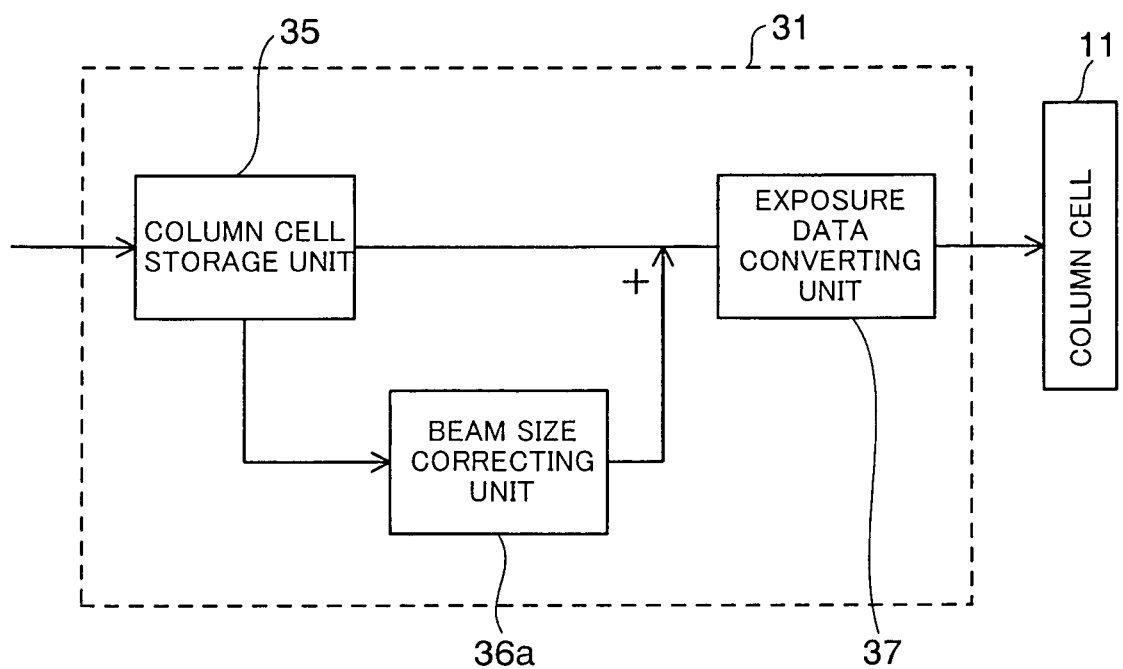
FIG. 4 is a block diagram showing a configuration of a column cell controlling module according to a first embodiment.

FIG. 4 is a block diagram showing a configuration of each of the column cell controlling modules 31 according to this embodiment. Each of the column cell controlling modules 31 is configured to have a beam size correcting unit 36a and an exposure data converting unit 37. The beam size correcting unit 36a establishes an amount of correction of a beam size corresponding to beam size data which have been received from the column cell storage unit 35 in which the exposure data are stored. The exposure data converting unit 37 converts the beam size data to data on a beam size to be actually used for the exposure.

The exposure data is transferred to each of the column cell storing units 35 from the integral storing unit 33 which is commonly used by the column cells. The exposure data include the beam size data $(Sx_j, Sy_j)$, exposure position data $(X_j, Y_j)$, light exposure data D. The beam size data $(Sx_j, Sy_j)$ means that, in the j th column cell a component in the X-axis direction is Sx, and a component in the Y-axis direction is Sy. The column cell controlling module 31 sequentially reads the beam size data $(Sx_j, Sy_j)$ from the column cell storing unit 35, and the beam size correcting unit 36a outputs an amount of size correction $(\Delta Sx_j, \Delta Sy_j)$ corresponding to the value. The exposure data converting unit 37 converts the beam size data $(Sx_j, Sy_j)$ to a post-correction value $(Sx_j+\Delta Sx_j, Sy_j+\Delta Sy_j)$, and thus calculates data needed for an exposure process. Subsequently, the exposure data converting unit 37 outputs the calculation result to the column cell, and the exposure process is performed.

Next, descriptions will be provided for a process of figuring out the aforementioned correction amount.

Figure 5A:
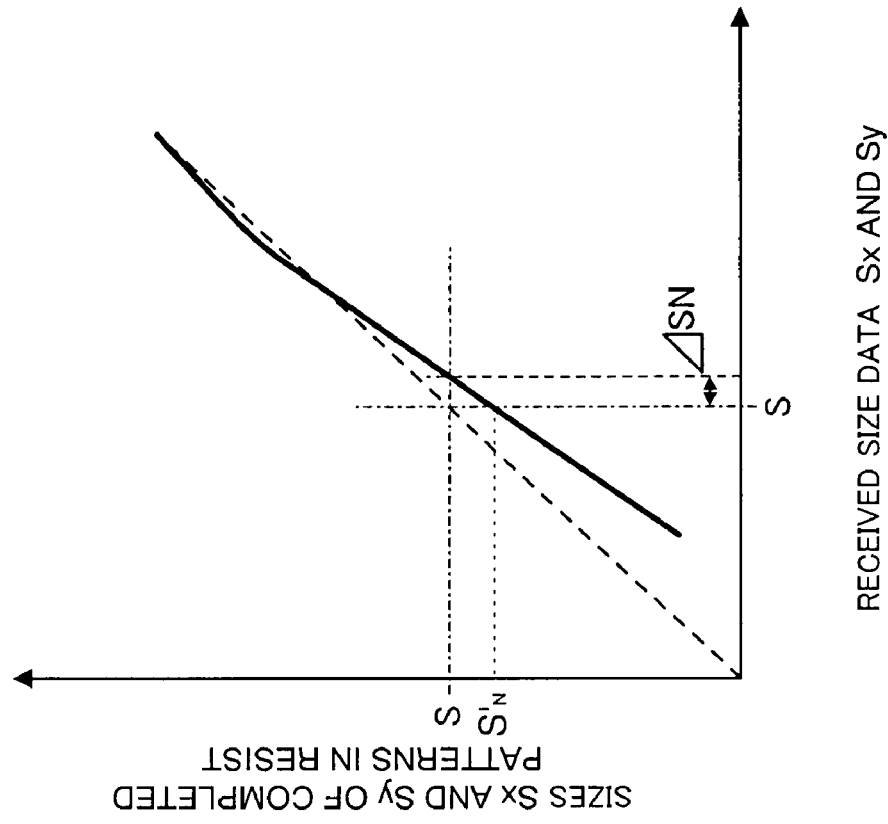
FIGS. 5A and 5B are diagrams (Part 1) each showing a relationship between received size data and size correction.
Figure 5B:
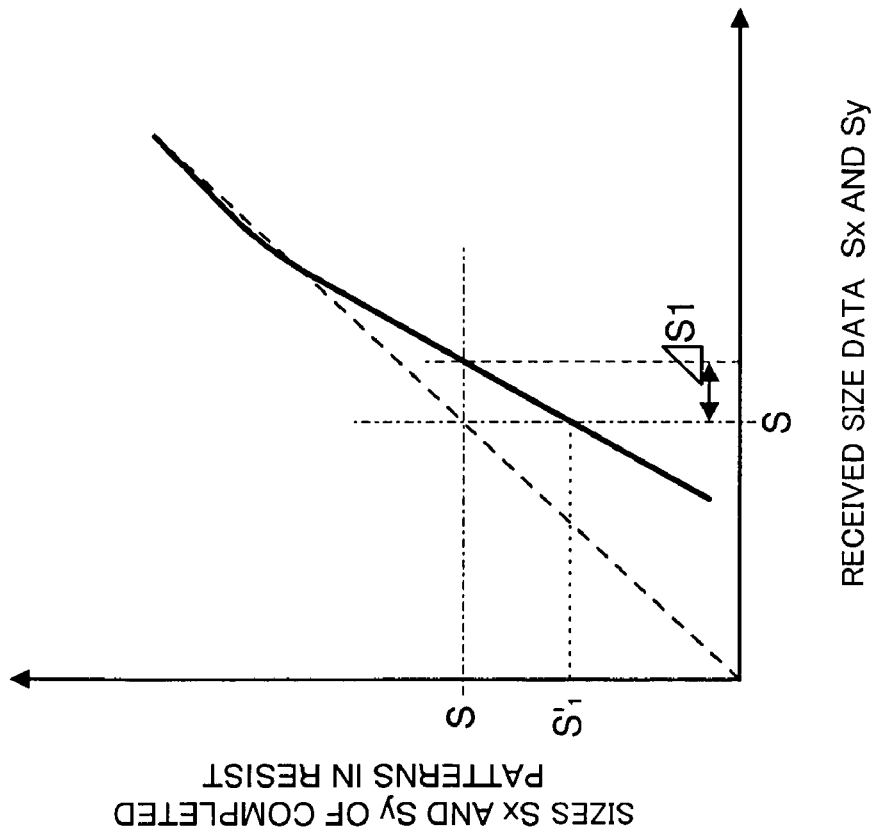

FIGS. 5A and 5B are diagrams each showing a relationship between received size data and size correction. The axis of abscissa of each of FIGS. 5A and 5B indicates size data specified on the basis of the exposure data, and the axis of ordinate of each of FIGS. 5A and 5B indicates dimensions of patterns which are formed in a case where an intended resist exposed with the reference light exposure. The solid line of each of FIGS. 5A and 5B indicates sizes of patterns which are actually formed as a result of exposure by specifying the pattern sizes. As shown in each of FIGS. 5A and 5B, when specified pattern sizes are larger than a certain value, patterns exactly in the specified desired sizes are formed with the reference light exposure. However, when the specified pattern sizes are more microscopic, the sizes of patterns which are actually formed are different from the specified sizes. Each of FIGS. 5A and 5B shows that, the sizes of patterns which are formed in the case where an electron beam is irradiated with the reference light exposure are smaller than the sizes of patterns which are to be actually formed.

Beam sizes are corrected in order that patterns to be actually formed can be in the desired size. In each of FIGS. 5A and 5B, when a desired pattern size is S, the sizes of patterns which are actually formed by exposure are S'. It is learned from FIG. 5A that size patterns to be specified should be larger than S by $\Delta S1$ in order that S-sized patterns can be actually formed as a result of an exposure. With this taken into consideration, a combination of pattern sizes to be specified with correction amounts for actually forming patterns in the specified size is recorded, as a database, in the beam size correcting unit 36a in each of the column cells.

In addition, in the case where an electron beam is irradiated with the reference light exposure, patterns actually formed by the exposure are different from one another depending on the pattern sizes, and such an error occurs individually in each of the column cells 11. FIG. 5A shows a result of exposing a pattern with the first column cell, and FIG. 5B shows a result of exposing a pattern with the Nth column cell. The difference in result between the two column cells stems from a slight difference in sharpness, a difference in roughness of the edge of the rectangular opening, a difference in irradiation uniformity, an error of beam adjustment, and the like, between the two column cells. Each of these two column cells shapes a beam with a cross section of a microscopic variable rectangle. For this reason, the aforementioned correction is carried out in each of the column cells 11.

As described above, in the case of the multicolumn electron-beam exposure system according to this embodiment, exposures are beforehand performed with the reference light exposure in order that patterns in the specified size will be formed on resists intended to be exposed. Thus, amounts of correction necessary for forming the patterns that match the specified size are calculated. Then, relationships between each of the specified sizes and corresponding one of the amounts of correction are recorded. On the basis of these relationships, the exposure data are corrected. Accordingly, even in a case where microscopic-sized variable rectangles are exposed, it is possible to form the same patterns in areas on a workpiece with the respective electron beams which have passed through the column cells. This makes it possible to increase the throughput of the exposure.

(Description of Multicolumn Electron-Beam Exposure Method)

Next, descriptions will be provided for an exposure method of forming the same patterns in areas on a workpiece even in a case where microscopic variable rectangles are exposed by use of the aforementioned multicolumn electron-beam exposure system.

Figure 6:
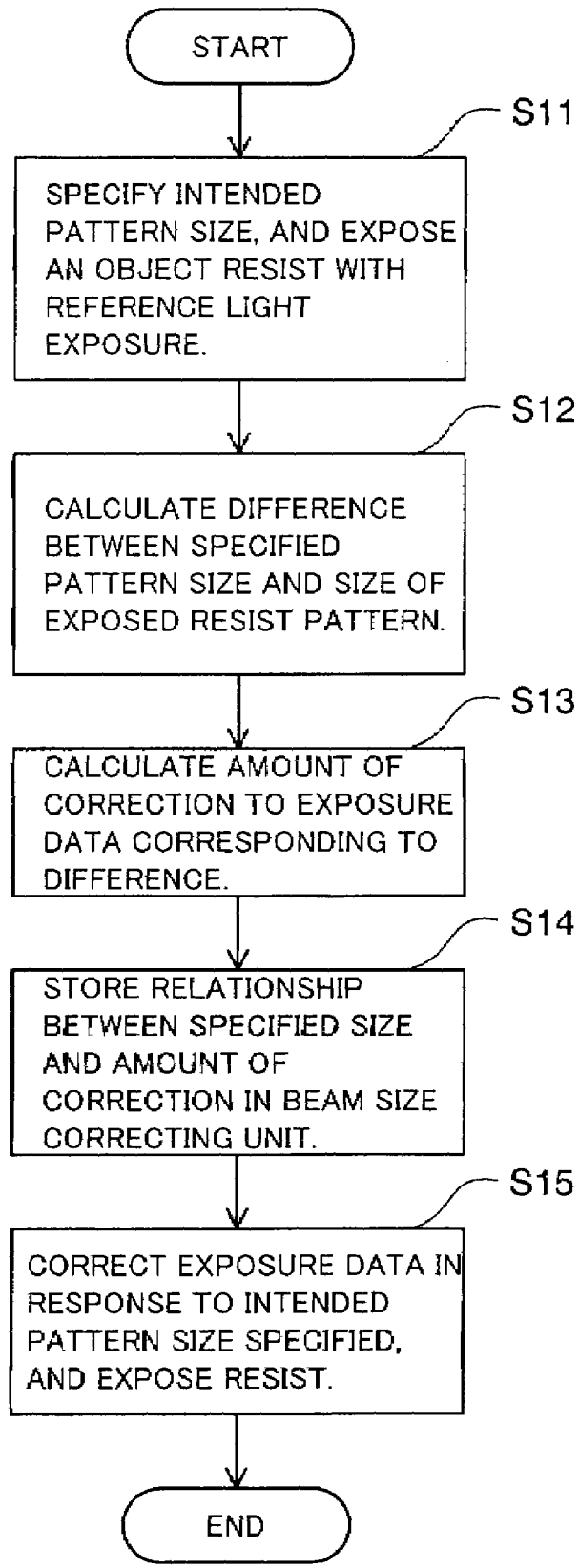
FIG. 6 is a flowchart showing an exposure method according to the first embodiment.

FIG. 6 is a flowchart for explaining a multicolumn electron-beam exposure system according to this embodiment.

First of all, in step S11, an intended pattern size is specified. Thus, a resist intended to be ultimately exposed is exposed in advance for a reference flash time length calculated on the basis of the reference light exposure. This process is carried out for each of a plurality of pattern sizes by means of changing components in the X-axis directions and components in the Y-axis directions. The results are expressed into a graph, for example, as shown in FIGS. 5A and 5B.

Then, in step S12, the difference between each of the specified pattern sizes and a size of a resist pattern which has been actually obtained by the exposure is calculated.

Subsequently, in step S13, an amount of correction to the exposure data corresponding to the difference which has been calculated in step S12 is calculated. For example, in the case of FIG. 5A, it is known that, in order to form a pattern exactly in the specified size S as a result of exposure, it is sufficient that a pattern size to be specified is made larger than the specified size S by ΔS1. With this taken into consideration, the difference ΔS1 between the pattern size to be specified and the size of pattern actually obtained by the exposure is used as an amount of correction. Such a process is carried out for every pattern size to be specified.

Thereafter, in step S14, a relationship between each of the sizes to be specified and a corresponding one of correction amounts is stored, as a database, in the beam size correcting unit 36a. The sizes to be specified have been figured out in step S13.

Next, in step S15, patterns are exposed respectively with the column cells by means of correcting the exposure data in response to the intended pattern size, which has been specified, respectively in the column cells.

In the case of the exposure method according to this embodiment, as described above, a pattern size is actually specified for a resist intended to be exposed. Then, the resist is exposed with the reference light exposure corresponding to the size thus specified. Thereafter, comparison is made between the size of a pattern obtained as a result of the actual exposure and the specified size. Thus, an amount of correction needed for forming the pattern exactly in the specified size is determined. Then, a relationship between the specified size and the amount of correction needed for forming the pattern exactly in the specified size is stored into the database. Subsequently, each time the resist is intended to be exposed, an amount of correction is obtained on the basis of the reference light exposure, and thus exposure data actually needed are determined. Accordingly, it becomes possible to form the same patterns with electron beams which have passed respectively through the column cells even in the case where the microscopic patterns are intended to be exposed using beams whose cross sections have a variable rectangular shape. As a result, it is possible to increase the throughput of the exposure.

SECOND EMBODIMENT

In the case of the first embodiment, desired patterns are formed by means of correcting the size data in the reference exposure data in order that the patterns can be formed exactly in the specified pattern size. By contrast, in the case of a second embodiment, desired patterns are formed by means of adjusting shot time lengths for exposure.

Figure 7:
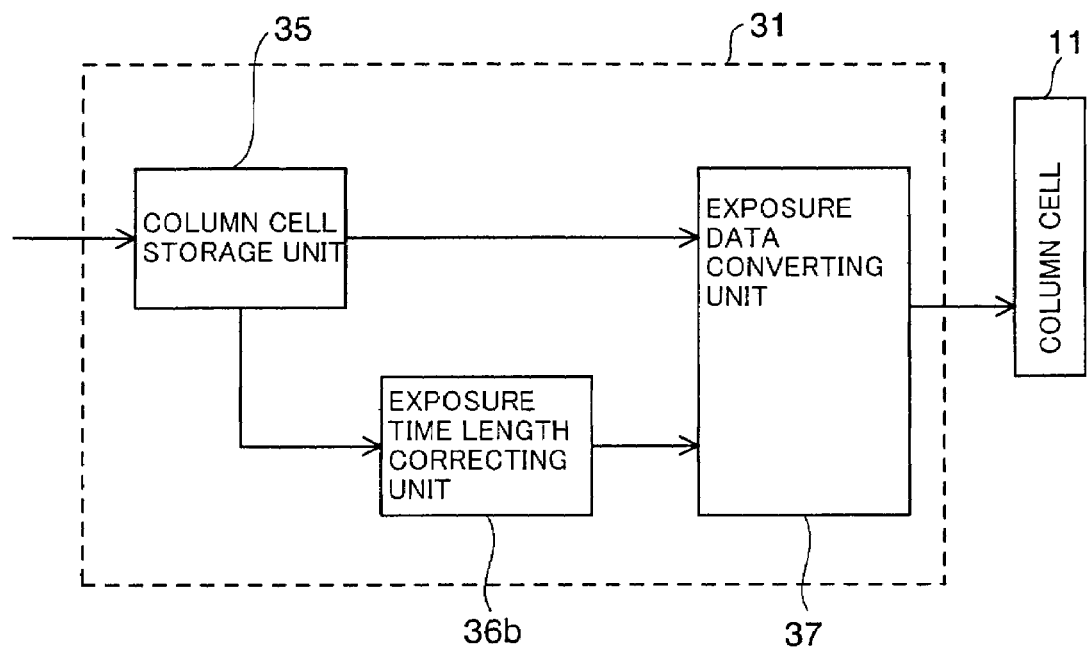
FIG. 7 is a block diagram showing a configuration of a column cell controlling module according to a second embodiment.

FIG. 7 is a block diagram showing a configuration of each of the column cell controlling modules 31 according to this embodiment. Each of the column cell controlling modules 31 is configured to have a column cell storage unit 35, an exposure time length correcting unit 36b and an exposure data converting unit 37. The exposure time length correcting unit 36b establishes an amount of correction to a flash time length for which a beam is being irradiated, the flash time length corresponding to beam size data which have been received from the column cell storage unit 35. The exposure data converting unit 37 converts the beam size data to data on a beam size to be actually used for exposure.

The exposure data is transferred to each of the column cell storing units 35 from the integral storing unit 33 which is commonly used by the column cells. The exposure data include the beam size data $(Sx_j, Sy_j)$, exposure position data $(X_j, Y_j)$, light exposure data D and current density J. The exposure time length correcting unit 36b sequentially reads the beam size data $(Sx_j, Sy_j)$, and obtains amounts $\Delta t_j$ of correction to the exposure flash time lengths corresponding to the data. Otherwise, the exposure time length correcting unit 36b obtains correction coefficients $\alpha_j$. Subsequently, the exposure data converting unit 37 converts the reference exposure flash time lengths, which have been calculated on the basis of the light exposure data D, to corrected exposure flash time lengths.

The corrected exposure flash time lengths $t_j'$ is calculated by the following equation.

$$t_j' = D/J_j + \Delta t_j$$

Otherwise, $$t_j' = \alpha_j \times D/J_j$$

The column cells are controlled by use of these calculated values, and thus the respective exposure processes are performed.

Next, descriptions will be provided for a process of figuring out the aforementioned amounts of correction.

Figure 8A:
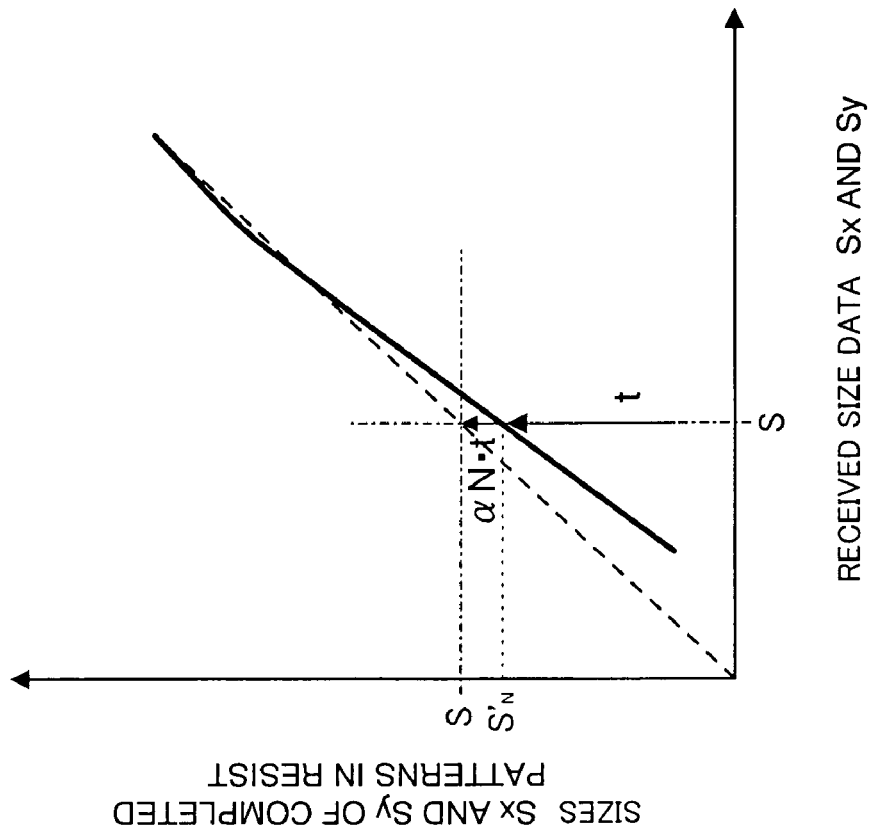
FIGS. 8A and 8B are diagrams (Part 2) each showing a relationship between received size data and size correction.
Figure 8B:
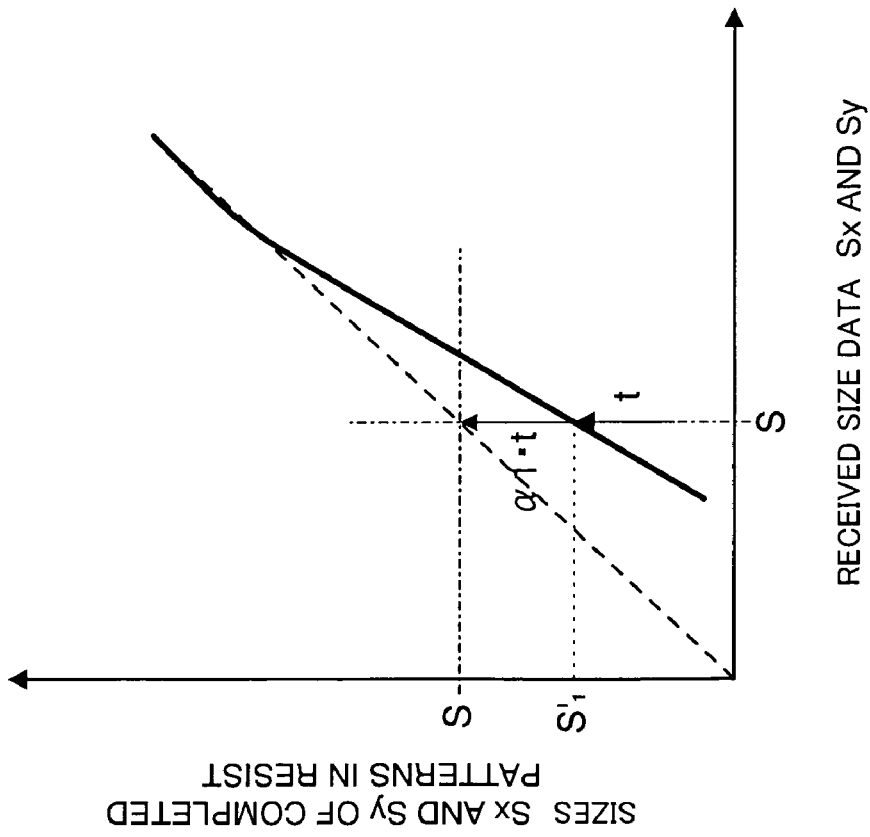

FIGS. 8A and 8B are diagrams each showing a relationship between received size data and size correction. The axis of abscissa of each of FIGS. 8A and 8B indicates size data specified on the basis of the exposure data, and the axis of ordinate of each of FIGS. 8A and 8B indicates dimensions of patterns which are formed in a case where an intended resist is exposed with the reference light exposure. As shown in each of FIGS. 8A and 8B, when specified pattern sizes are larger than a certain value, patterns exactly in the specified desired sizes are formed with the reference light exposure. However, when specified pattern sizes are more microscopic, the sizes of patterns which are actually formed are different from the specified sizes. Each of FIGS. 8A and 8B shows that, the sizes of patterns which are formed in the case where an electron beam is irradiated with the reference light exposure are smaller than the sizes of patterns which were to be actually formed.

Exposure flash time lengths are corrected in order that patterns to be actually formed can be in the desired size. In each of FIGS. 8A and 8B, when a desired pattern size is S. the size of a patterns which are actually formed by the exposure is S'. It is known from each of FIGS. 8A and 8B that, in order to actually form S-sized patterns as a result of an exposure, it is sufficient that the flash time lengths are made longer when the pattern size S is specified. In the case shown in FIG. 8A, it is sufficient that the flash time length is obtained by multiplying a value t, which is determined on the basis of the reference light exposure, by $\alpha 1$. With this taken into consideration, a combination of pattern sizes to be specified with amounts of correction obtained by adding flash time lengths is recorded as a database.

In addition, in the case where an electron beam is irradiated with the reference light exposure, patterns actually formed by the exposure are different from one another depending on the pattern sizes, and such an error occurs individually in each of the column cells, as in the cases of the first and the Nth column cells respectively shown in FIGS. 8A and 8B. For this reason, the aforementioned correction is carried out in each of the column cells.

Accordingly, even in a case where microscopic-sized variable rectangles are exposed, it is possible to form the same patterns in areas on a workpiece with the respective electron beams which have passed through the column cells. This makes it possible to increase the throughput of the exposure.

(Description of Multicolumn Electron-Beam Exposure Method)

Next, descriptions will be provided for an exposure method of forming the same patterns in areas on a workpiece even in a case where microscopic variable rectangles are exposed by use of the aforementioned multicolumn electron-beam exposure system. The exposure method according to this embodiment is basically the same as the exposure method according to the first embodiment except that the method of obtaining amounts of correction is different between the two exposure methods.

In the case of this embodiment, the amounts of correction to the exposure data are calculated in the following manner in step S13 of the flowchart shown in FIG. 6.

The difference between the size of a resist pattern to be exposed and an intended pattern size, which has been specified, and the intended pattern size specified is calculated. On the basis of the difference, an amount of correction to the flash time length is calculated in order that the size of the resist pattern becomes equal to the intended pattern size.

It is known, for example, from FIG. 8A that, in order to form a pattern with the specified size S, it is sufficient that the flash time length is obtained by multiplying a value t, which is determined on the basis of the reference light exposure, by $\alpha 1$. With this taken into consideration, the coefficient $\alpha 1$ on correction to this flash time length is used as an amount of correction. Such a process is carried out for every specified pattern size. Subsequently, a relationship between each of the sizes to be specified and a corresponding one of correction amounts is stored, as a database, in the exposure time length correcting unit 36b. Thus, patterns are exposed respectively with the column cells by correcting the exposure data in response to the intended pattern size, which has been specified, respectively in the column cells.

In the case of the exposure method according to this embodiment, as described above, a pattern size is beforehand specified for a resist intended to be exposed. Then, the resist is exposed with the size thus specified. Thereafter, comparison is made between the size of a pattern obtained as a result of the exposure and the specified size. Thus, an amount of correction needed for forming the pattern exactly in the specified size is determined. Then, a relationship between the specified size and the amount of correction needed for forming the pattern exactly in the specified size is stored into the database. Subsequently, each time the resist is intended to be exposed, a flash time length needed for the exposure is obtained. Accordingly, it becomes possible to form the same patterns with electron beams which have passed respectively through the column cells even in the case where the microscopic patterns are intended to be exposed using beams whose cross sections have a variable rectangular shape. As a result, it is possible to increase the throughput of the exposure.

What is claimed is:

1. A multicolumn electron-beam exposure system comprising:
    a plurality of column cells, which are arranged above a single wafer, and each of which includes an electron gun and deflection means which deflects an electron beam irradiated from the electron gun;
    common storage means which stores common exposure data used by the plurality of column cells; and
    size data correcting means which is provided to each of the column cells, and which receives size data on a variable-shaped beam from the common storage means, thus outputting an amount of correction to the size data;
    wherein the amount of correction is size data on the variable-shaped beam, which corresponds to a difference between an intended pattern size and a size of a resist pattern which has been formed on a resist as a result of specifying the intended pattern size.

2. The multicolumn electron-beam exposure system according to claim 1, wherein each of the column cells further comprises exposure data converting means which converts the size data to corrected size data on the basis of the amount of correction obtained by the size data correcting means, and which thus calculates an amount of control for operating each of the column cells, thereafter outputting the amount of control to each of the column cells.

3. The multicolumn electron-beam exposure system according to claim 2, wherein, when lengths in the X-axis and Y-axis directions of the variable-shaped beam are respectively Sx and Sy, and when lengths in the X-axis and Y-axis directions of the amount of correction are respectively $\Delta$Sx and $\Delta$Sy, the exposure data converting means sets lengths in the X-axis and Y-axis directions of the variable-shaped beam in the corrected size data respectively to Sx+$\Delta$Sx and Sy+$\Delta$Sy.

4. A multicolumn electron-beam exposure system comprising:
    a plurality of column cells which are arranged above a single wafer, and each of which includes an electron gun and deflection means which deflects an electron beam irradiated from the electron gun;
    common storage means which stores common exposure data used by the plurality of column cells; and
    flash time length correcting means which is provided to each of the column cells, and which receives size data on a variable-shaped beam from the common storage means, thus outputting any one of an amount of, and a coefficient on, correction to a flash time length for which the beam is being irradiated, the amount and the coefficient corresponding to the size data;

wherein the amount of correction or the coefficient of correction is respectively an amount or an coefficient on correction to the exposure flash time length, where the amount or coefficient of correction corresponds to a difference between an intended pattern size and a size of a resist pattern which has been formed on a resist by specifying an intended pattern size and a reference light exposure.

5. The multicolumn electron-beam exposure system according to claim 4, wherein each of the column cells further comprises exposure data converting means which converts the flash time length to corrected flash time length obtained by correction on the basis of any one of the amount of correction and the coefficient on correction which have been received from the flash time length correcting means, thus outputting the corrected flash time length to the column cell.

6. The multicolumn electron-beam exposure system according to claim 5, wherein the exposure data converting means expresses the corrected flash time length with $(D/J) \times \alpha$ when a reference light exposure, a current density and the coefficient on correction are denoted respectively by D, J and $\alpha$.

7. The multicolumn electron-beam exposure system according to claim 5, wherein the exposure data converting means expresses the corrected flash time length with $D/J+\Delta t$ when a reference light exposure, a current density and the amount of correction are denoted respectively by D, J and $\Delta t$.

8. A multicolumn electron-beam exposure method of exposing patterns on a single wafer in parallel by use of a plurality of column cells each for irradiating an electron beam on a workpiece while deflecting the electron beam, the multicolumn electron-beam exposure method comprising the steps of:

transferring a pattern onto a predetermined resist by exposure for a reference flash length time by use of each of the plurality of column cells on the basis of variable-shaped size data thereof;

measuring difference between the size of the pattern obtained in each of the column cells and an intended pattern size;

determining an amount of correction to the variable-shaped size data in order that the size of the pattern can be equal to the intended pattern size;

storing a relationship between the intended pattern size and the amount of correction in size data correcting means; and individually correcting the variable-shaped size data in each of the column cells in response to the intended pattern size of each of the column cells, and thus exposing the same patterns.

9. A multicolumn electron-beam exposure method of exposing patterns on a single wafer in parallel by use of a plurality of column cells each for irradiating an electron beam on a workpiece while deflecting the electron beam, the multicolumn electron-beam exposure method comprising the steps of:

transferring a pattern onto a predetermined resist by exposure for a reference flash time length by use of each of the plurality of column cells on the basis of variable-shaped size data thereof;

measuring difference between the size of the pattern obtained in each of the column cells and an intended pattern size;

determining an amount of correction to data on the reference flash time length in order that the size of the pattern can be equal to the intended pattern size;

storing a relationship between the intended pattern size and the amount of correction in flash time length correcting means; and individually correcting the data on the exposure flash time length in each of the column cells in response to the intended pattern size of each of the column cells, and thus exposing the same patterns.

* * * * *